US006951768B2

(12) United States Patent
Kubena et al.

(10) Patent No.: US 6,951,768 B2
(45) **Date of Patent: *Oct. 4, 2005**

(54) SINGLE CRYSTAL, DUAL WAFER, TUNNELING SENSOR OR SWITCH WITH SUBSTRATE PROTRUSION AND A METHOD OF MAKING SAME

(75) Inventors: Randall L. Kubena, Oak Park, CA (US); David T. Chang, Covina, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/370,124

(22) Filed: Feb. 18, 2003

(65) Prior Publication Data

US 2003/0151104 A1 Aug. 14, 2003

Related U.S. Application Data

(62) Division of application No. 09/629,680, filed on Aug. 1, 2000, now Pat. No. 6,563,184.

(51) Int. Cl.$^7$ .............................................. H01L 21/00

(52) U.S. Cl. ............................ 438/48; 438/50; 438/52; 438/53

(58) Field of Search ............................. 438/48, 50, 52, 438/53, 455, 458, 459

(56) References Cited

U.S. PATENT DOCUMENTS 5,015,850 A * 5/1991 Zdeblick et al. ............ 250/306
5,729,074 A 3/1998 Shiomi et al. .............. 310/309
5,994,750 A * 11/1999 Yagi ........................... 257/415
6,126,311 A 10/2000 Schuh ......................... 374/21
6,211,532 B1 * 4/2001 Yagi ............................ 257/40
6,229,190 B1 * 5/2001 Bryzek et al. .............. 257/419
6,337,027 B1 * 1/2002 Humphrey ...................... 216/2
6,555,404 B1 4/2003 Kubena et al. ............... 438/22
6,580,138 B1 6/2003 Kubena et al. ............. 257/415
6,630,367 B1 * 10/2003 Kubena et al. ............... 438/48

OTHER PUBLICATIONS

U.S. Appl. No. 10/233,874, filed Aug. 19, 2002, Kubena et al.
U.S. Appl. No. 10/358,471, filed Feb. 4, 2003, Kubena et al.
U.S. Appl. No. 10/429,988, filed May 6, 2003, Kubena et al.
U.S. Appl. No. 10/639,289, filed Aug. 11, 2003, Kubena et al.
Zavracky, P.M., et al., "Design and Process Considerations For A Tunneling Tip Accelerometer," *J. Micromech. Microeng.*, vol. 6, No. 3, pp. 192–199 (Sep. 1996).

* cited by examiner

*Primary Examiner*—Tom Thomas
*Assistant Examiner*—N. Drew Richards
(74) *Attorney, Agent, or Firm*—Ladas & Parry LLP

(57) ABSTRACT

A method of making a micro electromechanical switch or tunneling sensor. A cantilevered beam structure and a mating structure are defined on a first substrate or wafer; and at least one contact structure and a mating structure are defined on a second substrate or wafer, the mating structure on the second substrate or wafer being of a complementary shape to the mating structure on the first substrate or wafer. At least one of the mating structures includes a protrusion extending from a major surface of at least one of said substrates. A bonding layer, preferably a eutectic bonding layer, is provided on at least one of the mating structures. The mating structure of the first substrate is moved into a confronting relationship with the mating structure of the second substrate or wafer. Pressure is applied between the two substrates so as to cause a bond to occur between the two mating structures at the bonding or eutectic layer. Then the first substrate or wafer is removed to free the cantilevered beam structure for movement relative to the second substrate or wafer.

32 Claims, 10 Drawing Sheets

SINGLE CRYSTAL, DUAL WAFER, TUNNELING SENSOR OR SWITCH WITH SUBSTRATE PROTRUSION AND A METHOD OF MAKING SAME

RELATED APPLICATIONS

This application is a divisional of prior U.S. patent application Ser. No. 09/629,680 filed on Aug. 1, 2000, (now U.S. Pat. No. 6,563,184), entitled "A Single Crystal, Dual Wafer, Tunneling Sensor or Switch with Substrate Protrusion and a Method of Making Same." This invention is related to other inventions which are the subject of separate patent applications filed thereon. See: U.S. patent application Ser. No. 09/629,682, filed on Aug. 1, 2000 issued as U.S. Pat. No. 6,580,138 on Jun. 17, 2003, entitled "A Single Crystal, Dual Wafer, Tunneling Sensor or Switch with Silicon on Insulator Substrate and a Method of Making Same," the disclosure of which is incorporated herein by reference, and a divisional application of that application, U.S. patent application Ser. No. 10/358,471, filed Feb. 4, 2003; U.S. patent application Ser. No. 09/629,684, filed on Aug. 1, 2000, entitled "A Single Crystal, Dual Wafer, Tunneling Sensor and a Method of Making Same" the disclosure of which is incorporated herein by reference, and a divisional application of that application, U.S. patent application Ser. No. 10/429,988, filed May 6, 2003; U.S. patent application Ser. No. 09/629,679, filed on Aug. 1, 2000, issued as U.S. Pat. No. 6,555,404 on Apr. 29, 2003, entitled "A Single Crystal, Dual Wafer, Gyroscope and A Method of Making Same," the disclosure of which is incorporated herein by reference, and a divisional application of that application, U.S. patent application Ser. No. 10/223,874, filed Aug. 19, 2002; U.S. patent application Ser. No. 09/629,683, filed on Aug. 1, 2000 entitled "A Single Crystal, Tunneling and Capacitive, Three Axes Sensor Using Eutectic Bonding and a Method of Making Same," the disclosure of which is incorporated herein by reference, and a divisional application of that application, U.S. patent application Ser. No. 10/639,289, filed Aug. 11, 2003.

TECHNICAL FIELD

The present invention relates to micro electromechanical (MEM) tunneling sensors and switches using dual wafers which are bonded together preferably eutectically.

BACKGROUND OF THE INVENTION

The present invention provides a new process of fabricating a single crystal silicon MEM tunneling devices using low-cost bulk micromachining techniques while providing the advantages of surface micromachining. The prior art, in terms of surface micromachining, uses e-beam evaporated metal that is patterned on a silicon dioxide ($SiO_2$) layer to form the control, self-test, and tip electrodes of a tunneling MEM switch or sensor. A cantilevered beam is then formed over the electrodes using a sacrificial resist layer, a plating seed layer, a resist mold, and metal electroplating. Finally, the sacrificial layer is removed using a series of chemical etchants. The prior art for bulk micromachining has utilized either mechanical pins and/or epoxy for the assembly of multi-Si wafer stacks, a multi-Si wafer stack using metal-to-metal bonding and an active sandwiched membrane of silicon nitride and metal, or a dissolved wafer process on quartz substrates (Si-on-quartz) using anodic bonding. None of these bulk micromachining processes allow one to fabricate a single crystal Si cantilever (with no deposited layers over broad areas on the beam which can produce thermally mismatched expansion coefficients) above a set of tunneling electrodes on a Si substrate and also electrically connect the cantilever to pads located on the substrate and at the same time affording good structural stability. The fabrication techniques described herein provide these capabilities in addition to providing a low temperature process so that CMOS circuitry can be fabricated in the Si substrate before the MEMS switches and/or sensors are added. Finally, the use of single crystal Si for the cantilever provides for improved process reproductibility for controlling the stress and device geometry. A protrusion is formed on at least one of the substrates to provide better mechanical stability to the resulting switch or sensor.

Tunneling switches and sensors may be used in various military, navigation, automotive, and space applications. Space applications include satellite stabilization in which MEM switch and sensor technology can significantly reduce the cost, power, and weight of the presently used gyro systems. Automotive air bag deployment, ride control, and anti-lock brake systems provide other applications for MEM switches and sensors. Military applications include high dynamic range accelerometers and low drift gyros.

MEM switches and sensors are rather similar to each other. The differences between MEM switches and MEM sensors will be clear in the detailed disclosure of the invention.

BRIEF DESCRIPTION OF THE INVENTION

Generally speaking, the present invention provides a method of making a micro electro-mechanical switch or sensor wherein a cantilevered beam structure and a mating structure are defined on a first substrate or wafer and at least one contact structure and a mating structure are defined on a second substrate or wafer. The mating structure on the second substrate or wafer is of a complementary shape to the mating structures on the first substrate or wafer. At least one of the two mating structures includes a silicon protrusion extending from the wafer on which the corresponding unit is fabricated. A bonding or eutectic layer is provided on at least one of the mating structures and the mating structure are moved into a confronting relationship with each other. Pressure is then applied between the two substrates and heat may also be applied so as-to cause a bond to occur between the two mating structures at the bonding or eutectic layer. Then the first substrate or wafer is removed to free the cantilevered beam structure for movement relative to the second substrate or wafer. The bonding or eutectic layer also provides a convenient electrical path to the cantilevered beam for making a circuit with the contact formed on the cantilevered beam.

In another aspect, the present invention provides an assembly or assemblies for making a single crystal silicon MEM switch or sensor therefrom. A first substrate or wafer is provided upon which is defined a beam structure and a mating structure. A second substrate or wafer is provided upon which is defined at least one contact structure and a mating structure, the mating structure on the second substrate or wafer being of a complementary shape to the mating structure on the first substrate or wafer. At least one of the two mating structures includes a silicon protrusion extending from the wafer on which the corresponding unit is fabricated. A pressure and heat sensitive bonding layer is disposed on at least one of the mating structures for bonding the mating structure defined on the first substrate or wafer with the mating structure on the second substrate in response to the application of pressure and heat therebetween.

BRIEF DESCRIPTION OF THE FIGURES

FIGS. 1A through 6A depict the fabrication of a first embodiment of the cantilever portion of a MEM sensor.

FIGS. 1B through 6B correspond to FIGS. 1A–6A, but show the cantilever portion, during its various stages of fabrication, in plan view:

FIGS. 7A through 11A show, in cross section view, the fabrication of the base portion of the first embodiment tunneling sensor;

FIGS. 7B through 11B correspond to FIGS. 7A–9A but show the fabrication process for the base portion in plan view;

FIGS. 16A through 21A depict, in cross sectional view, a modification applicable to the first embodiment of the cantilever portion of the MEM sensor;

FIGS. 16B through 21B correspond to FIGS. 16A–21A, but show the fabrication process for the modification in plan view;

DETAILED DESCRIPTION

Several embodiments of the invention will be described with respect to the aforementioned figures. The first embodiment will be described with reference to FIGS. 1A through 15. A second embodiment will be discussed with reference to FIGS. 16 through 21B. Further additional embodiments and modifications are described thereafter. Since some of the fabrication steps are the same for many of the embodiments, reference will often be made to earlier discussed embodiments to reduce repetition.

The MEM devices shown in the accompanying figures are not drawn to scale, but rather are drawn to depict the relevant structures for those skilled in this art. Those skilled in this art realize that these devices, while mechanical in nature, are very small and are typically manufactured using generally the same type of technology used to produce semiconductor devices. Thus a thousand or more devices might well be manufactured at one time on a wafer. To gain an appreciation of the small scale of these devices, the reader may wish to turn to FIG. 15 which includes size information for a preferred embodiment of a MEM sensor utilizing the present invention. The figure numbers with the letter 'A' appended thereto are section views taken as indicated in the associated figure numbers with the letter 'B' appended thereto, but generally speaking only those structures which occur at the section are shown and not structures which are behind the section. For example, in FIG. 2A, the portion of the mask 14 which forms the upper arm of the letter E shaped structure seen in FIG. 2B does not appear in FIG. 2A since it is located spaced from the plane where the section is taken. The section views are thus drawn for ease of illustration.

Figure 1A:
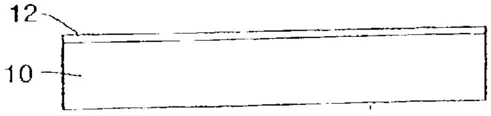
Figure 1B:
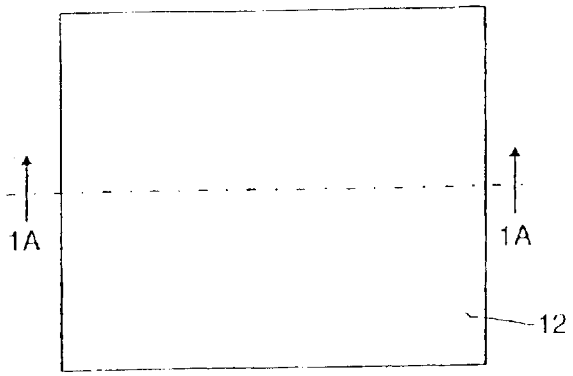

Turning to FIGS. 1A and 1B, a starting wafer for the fabrication of the cantilever is depicted. The starting wafer includes a wafer of bulk n-type silicon (Si) 10 upon which is formed a thin layer of doped p-type silicon 12. The silicon wafer 10 is preferably of a single crystalline structure having a <100> crystalline orientation. The p-type silicon layer 12 may be grown as an epitaxial layer on silicon wafer 10. The layer 12 preferably has a thickness of in the range of 1 to 20 micrometers ($\mu$m), but can have a thickness anywhere in the range of 0.1 $\mu$m to 800 $\mu$m. Generally speaking, the longer the cantilevered beam is the thicker the beam is. Since layer 12 will eventually form the cantilevered beam, the thickness of layer 12 is selected to suit the length of the beam to be formed.

Layer 12 may be doped with Boron such that its resistivity is reduced to less than 0.05 Ω-cm and is preferably doped to drop its resistivity to the range of 0.01 to 0.05 Ω-cm. The resistivity of the bulk silicon wafer or substrate 10 is preferably about 10 Ω-cm. Boron is a relatively small atom compared to silicon, and therefore including it as a dopant at the levels needed ($10^{20}$) in order to reduce the resistivity of the layer 12 tends to induce stress which is preferably compensated for by also doping, at a similar concentration level, a non-impurity atom having a larger atom size, such as germanium. Germanium is considered a non-impurity since it neither contributes nor removes any electron carriers in the resulting material.

Figure 2A:
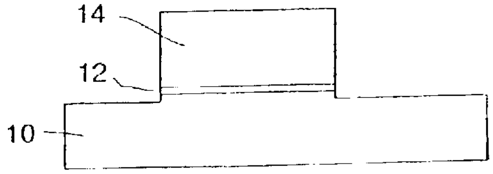
Figure 2B:
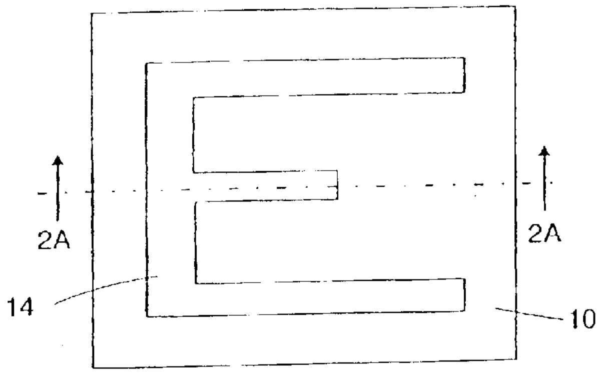

Layer 12 shown in FIGS. 1A and 1B is patterned using well known photolithographic techniques by forming a mask layer, patterned as shown at numeral 14, preferably to assume the shape of a capital letter 'E' when viewed in plan view (see FIG. 2B). While the shape of the capital letter 'E' is preferred, other shapes can be used. In this embodiment, the outer peripheral portion of the E-shape will form a mating structure which will be used to join the cantilevered beam forming portion 2 of the sensor to its base portion 4 (see FIGS. 12 and 13).

After the mask layer 14 has been patterned as shown in FIGS. 2A and 2B, the wafer is subjected to a plasma etch, for example, in order to etch through the thin layer of p-type doped silicon 12 and also to over etch into the silicon wafer 10 by a distance of approximately 500 Å.

Figure 3A:
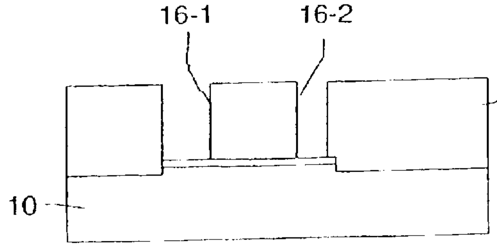
Figure 3B:
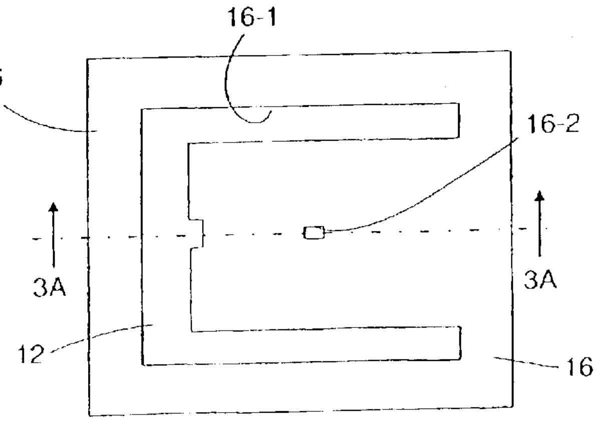

The mask 14 shown in FIGS. 2A and 2B is then removed and another photoresist layer 16 is applied which is patterned as shown in FIGS. 3A and 3B by providing two openings therein 16-1 and 16-2. Opening 16-1 basically follows the outer perimeter of the 'E' shape of the underlying thin layer of p-type silicon 12 while opening 16-2 is disposed at or adjacent a tip of the interior leg of the 'E'-shaped p-type silicon layer 12.

Layers of Ti/Pt/Au are next deposited over mask 16 and through openings 16-1 and 16-2 to form a post contact 18-1 and a tunnelling tip contact 18-2. The Ti/Pt/Au layers preferably have a total thickness of about 2000 Å. The individual layers of Ti and Pt may have thicknesses in the ranges of 100–200 Å and 1000–2000 Å, respectively. After removal of the photoresist 16, the wafer is subjected to a sintering step at approximately 520° C. to form an ohmic Ti—Si juncture between contacts 18-1 and 18-2 and the underlying layer 12. As will be seen with reference to FIGS. 24A–28B, the sintering step can be eliminated if a metal layer, for example, is used to connect contacts 18-1 and 18-2.

As another alternative, which does rely on the aforementioned sintering step occurring, post contact 18-1 may be formed by layers of Ti and Au (i.e without Pt), which would involve an additional masking step to eliminate the Pt layer from post contact 18-1. However, in this alternative, the sintering would cause Si to migrate into the Au to form an Au/Si eutectic at the exposed portion of post contact 18-1 shown in FIGS. 4A and 4B. As a further alternative, the exposed portion of the post contact 18-1 shown in FIGS. 4A and 4B could simply be deposited as Au/Si eutectic, in which case the Pt layer in the post contact 18-1 could be optionally included. Post contact 18-1 may be eliminated if the subsequently described bonding between the cantilevered beam forming portion 2 and the base portion 4 occurs non-eutectically.

Figure 4A:
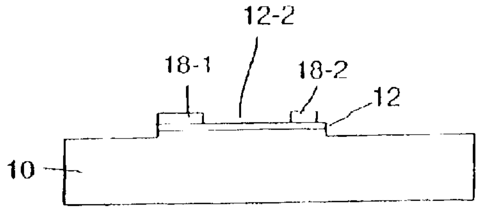
Figure 4B:
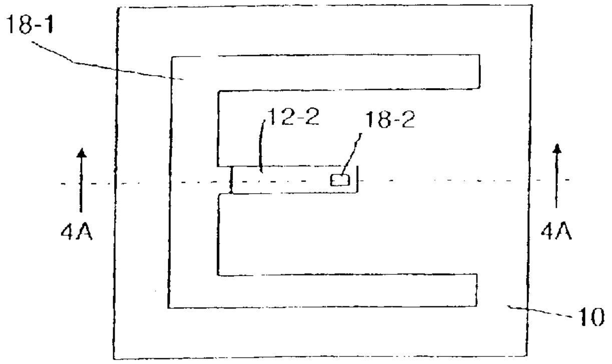

As a result, the exposed portion of the post contact 18-1 shown in FIGS. 4A and 4B is formed, preferably either by Au or by Au/Si. When the cantilevered forming portion 2 and the base portion 4 are mated as shown and described with reference to FIGS. 12 and 13, one of the exposed mating surfaces is preferably a Au/Si eutectic while the other is preferably Au. Thus, exposed mating surfaces 18-1, 18-3 can preferably be either Au and Au/Si if the exposed mating surface on the base portion 4 is the other material, i.e., preferably either Au/Si or Au so that a layer of Au/Si confronts a layer of Au.

Figure 5A:
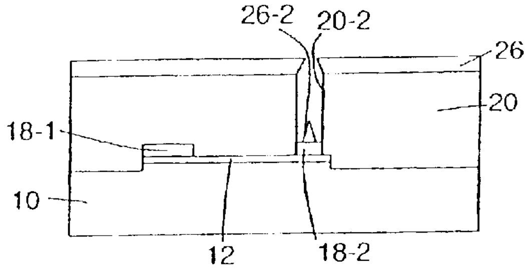
Figure 5B:
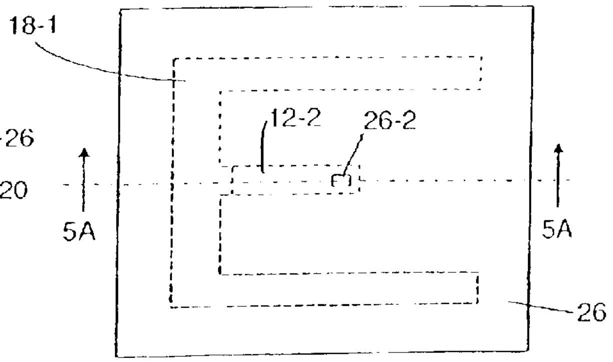
Figure 6A:
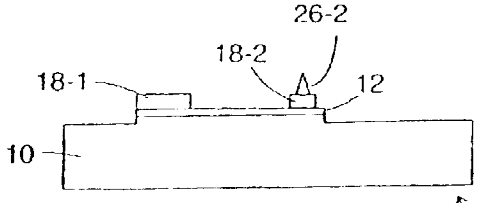
Figure 6B:
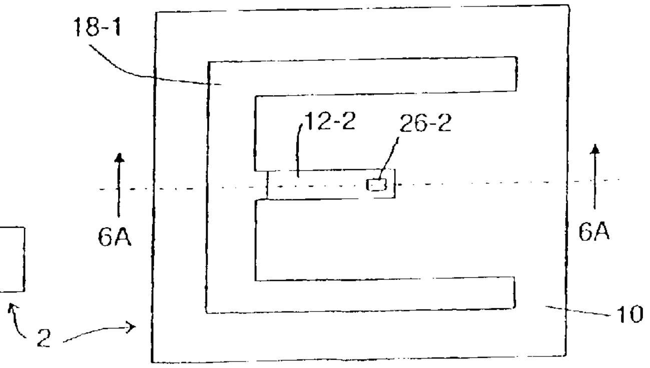

After the structure shown by FIGS. 4A and 4B is arrived at, a layer of photoresist 20 is put down and patterned to have a single opening 20-2 therein as shown in FIGS. 5A and 5B. A layer of gold 26, preferably having a thickness of 15,000 Å, is applied over the photoresist 20' and the gold, as it deposits upon contact 18-2 through opening 20-2, will assume a pyramidal-like or conical-like shape so as to form a pointed contact 26-2 due to the formation of an overhang at the opening 20-2 during the deposition of the gold layer 26. After contact 26-2 is formed, the remaining photoresist 20' is dissolved so that the cantilever beam structure then appears as shown in FIGS. 6A and 6B. The mating structure is provided by layer 18-1 in this embodiment. Those skilled in the art will appreciate that the size of the openings 16-1, 16-2 and 20-2 are not drawn to scale on the figures and that openings 16-2 and 20-2 would tend to be significantly smaller than would be opening 16-1. As such, when a rather thick layer 26 of Au is deposited on the wafer, those skilled in the art will appreciate that there is some fill-in at the sides of a mask when layer 26 is deposited because of an increasing overhang which occurs at the edges of opening 20-2 as the deposition process proceeds. Since opening 20-2 is rather narrow to begin with, the Au deposited through opening 20-2, which is shown at numeral 26-2, assumes a pyramidal-like or conical-like shape. The thickness of the deposition of Au layer 26 is generally sufficiently thick to assure that layer 26 will close across the top of opening 20-2 during the deposition process and so that structure 26-2 assumes its pointed configuration.

The layer of photoresist 20 is then removed so that then the cantilevered beam forming portion 2 of the sensor appears as depicted by FIGS. 6A and 6B.

Figure 7A:
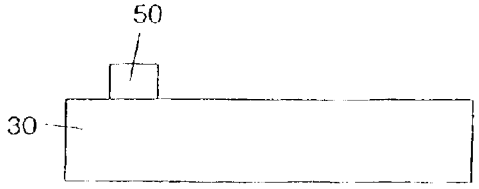
Figure 7B:
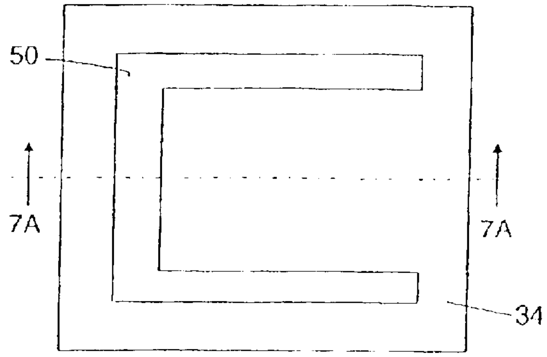
Figure 8A:
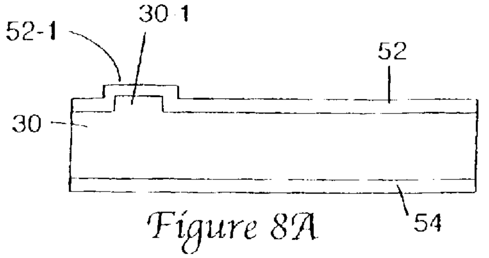
Figure 8B:
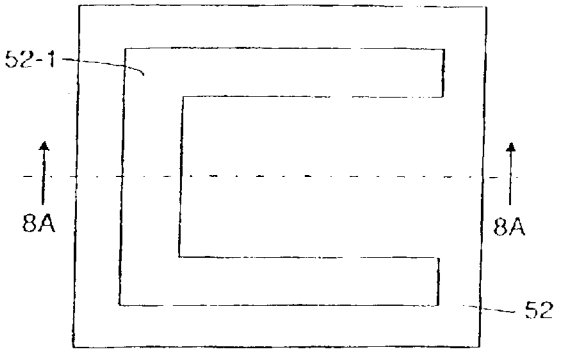

The fabrication of the base portion 4 of this embodiment of the MEM sensor will now be described with reference to FIGS. 7A through 11B. Turning to FIGS. 7A and 7B, a wafer 30 of silicon is shown upon which a layer of photoresist 50 has been deposited and patterned to assume preferably the outerperipheral shape of a capital letter 'E'. The exposed silicon is then subjected to an etch, etching it back approximately 20,000 Å, to define a protruding portion 30-1 of wafer 30 under the patterned mask 50 of the photoresist. The photoresist mask 50 is then removed and wafer 30 is oxidized to form layers of oxide 52, 54 on its exposed surfaces. The oxide layers are each preferably about 1 $\mu$m thick. Of course, the end surfaces shown in FIG. 8A are not shown as being oxidized because it is assumed that the pattern shown in FIG. 8A (and the other figures) is only one of a number of repeating patterns occurring across an entire wafer 30.

Figure 9A:
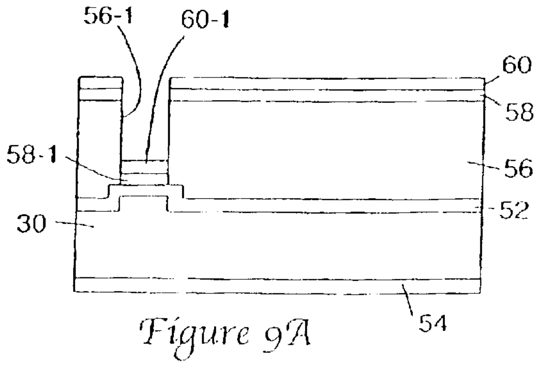
Figure 9B:
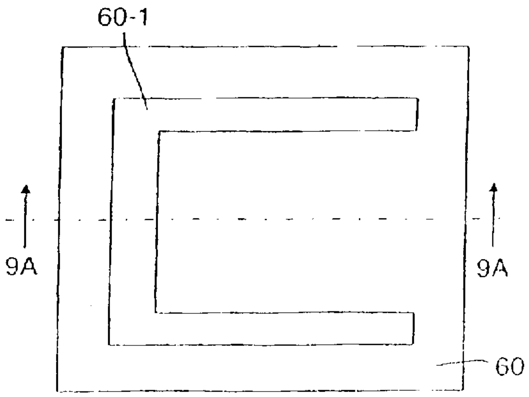

Turning to FIGS. 9A and 9B, a layer of photoresist 56 is applied having an opening therein 56-1 which again assumes the outerperipheral shape of a capital letter 'E', as previously described. Then, a layer of Ti/Pt/Au 58, preferably having a thickness of 2,000 Å, is deposited through opening 56-1 followed by the deposition of a layer 60 of an Au/Si eutectic preferably with a 1,000 Å thickness. Layers 58-1 of Ti/Pt/Au and 60-1 of the Au/Si eutectic are thus formed, which layers preferably follow the outerperipheral shape of a capital letter 'E', as can be clearly seen in FIG. 9B. Of course, if the post contact 18-1 (see FIG. 4A) is either formed of an Au/Si eutectic or has an Au/Si eutectic disposed thereon, then layers 60, 60-1 may be formed of simply Au or simply omitted due to the presence of Au at the exposed layer 58-1.

Figure 10A:
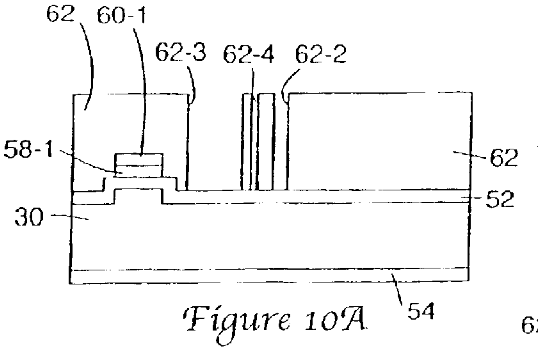
Figure 10B:
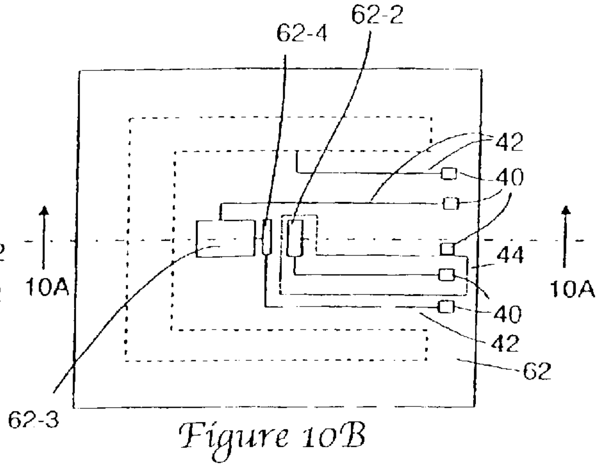
Figure 11A:
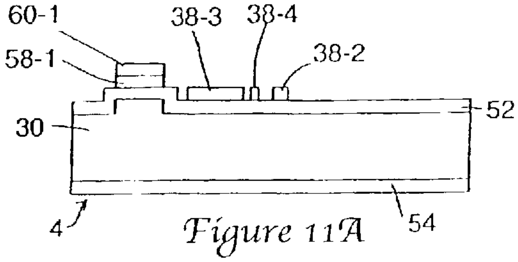
Figure 11B:
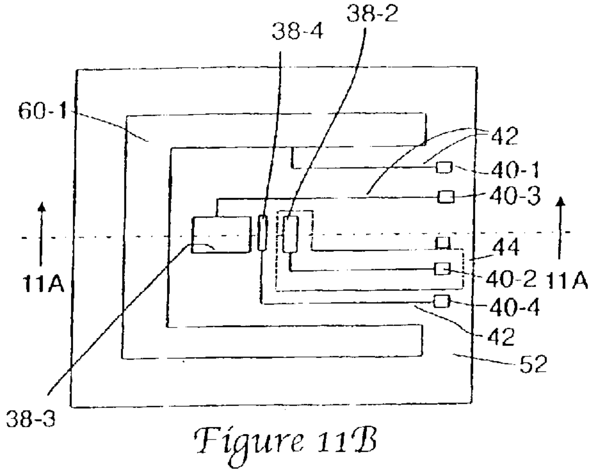

Photoresist layer 56 is then removed and a layer 62 of photoresist is applied and patterned to have (i) openings 62-2, 62-3 and 62-4, as shown in FIG. 10A, (ii) openings for pads 40-1 through 40-4 and their associated ribbon conductors 42 and (iii) an opening for guard ring 44 and its pad, as depicted in FIG. 10B. For the ease of illustration, the opening for guard ring 44 is not shown in FIG. 10A. A layer 38 of Ti/Pt/Au is then deposited over the patterned photoresist layer 62 and through openings 62-2 through 62-4 therein forming contacts 38-3, 38-4 and 38-2 and the photoresist 62 is removed to thereby arrive at the structure shown in FIGS. 11A and 11B. Those contacts are interconnected with their associated pads 40-2 through 44-4 by the aforementioned ribbon conductors 42, which contacts 40 and ribbon conductors 42 are preferably formed at the same time as contacts 38-3, 38-4 and 38-2 are formed. The outerperipheral layers 58-1 and 60-1 are also connected with pad 40-1 by an associated ribbon conductor 42. The protrusion 30-1, which preferably extends approximately 20,000 Å high above the adjacent portions of wafer 30', and the relatively thin layers 58-1 and 60-1 form the mating structure for the base portion 4.

Figure 12:
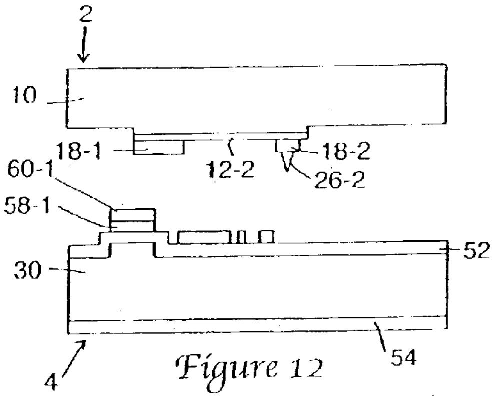
FIGS. 12 and 13 show the cantilever portion and the base portion being aligned with each other and being bonded together preferably by eutectic bonding.
Figure 13:
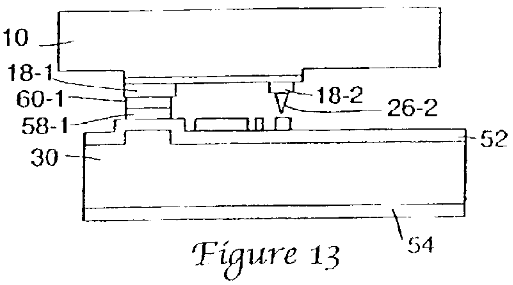
Figure 14A:
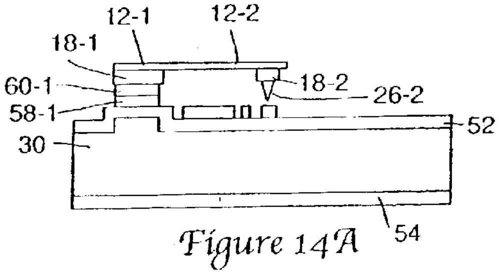
FIGS. 14A and 15 show the completed MEM sensor according to the first embodiment in cross sectional view, FIG. 15 being enlarged compared to FIG. 14A.
Figure 14B:
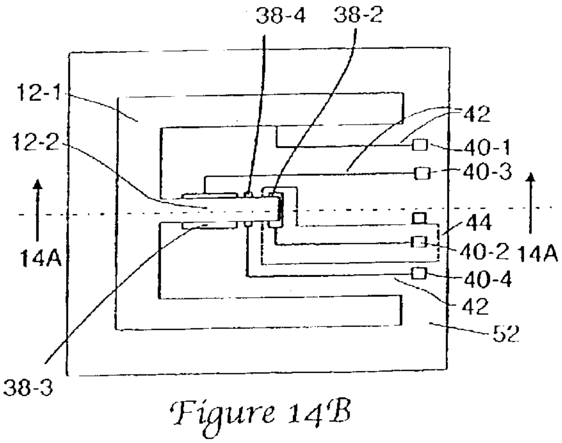
FIG. 14B shows the completed MEM sensor according to the first embodiment in plan view.

Turning to FIG. 12, the cantilevered beam forming is now bonded to base portion 4. As is shown in FIG. 12, the two wafers 10 and 30 are brought into a confronting relationship so that their mating structure 18-1, 30-1,58-1 and 60-1 are in alignment so that layers 18-1 and 60-1 properly mate with each other. Pressure and heat (preferably by applying a force of 5,000 N at 400° C. between three inch wafers 2, 4 having 1000 sensors disposed thereon) are applied so that eutectic bonding occurs between layers 18-1 and 60-1 as shown in FIG. 13. Thereafter, silicon wafer 10 is dissolved so that the MEM sensor structure shown in FIG. 14 is obtained. The p-type silicon layer 12 includes a portion 12-2 which serves as the cantilevered beam and another portion which is attached to the base portion 4 through the underlying layers. The gold contact 26-2 is coupled to pad 40-1 by elements 18-2, 12-2, 12-1, 18-1, 60-1, 58-1 and its associated ribbon conductor 42. If the bonding is done non-eutectically, then higher temperatures will be required.

Protrusion 30-1 and layers 18-1, 60-1, and 58-1 have preferably assumed the shape of the outerperpherial edge of a capital letter 'E' and therefore the moveable contact 26-2 of the MEM sensor is well protected by this physical shape. After performing the bonding, silicon layer 10 is dissolved away to arrive at the resulting MEM sensor shown in FIGS. 14A and 14B. The silicon can be dissolved with ethylenediamine pyrocatechol (EDP). This leaves only the Boron doped silicon cantilevered beam 12 with its associated contact 26-2 and its supporting or mating structure 18-1 bonded to the base structure 4. Preferable dimensions for the MEM sensor are given on FIG. 15. The beam as preferably has a length of 200 to 300 μm (0.2 to 0.3 mm).

Instead of using EDP as the etchant, plasma etching can be used if a thin layer of $SiO_2$ is used, for example, as an etch stop between layer 12 and substrate 10.

Figure 15:
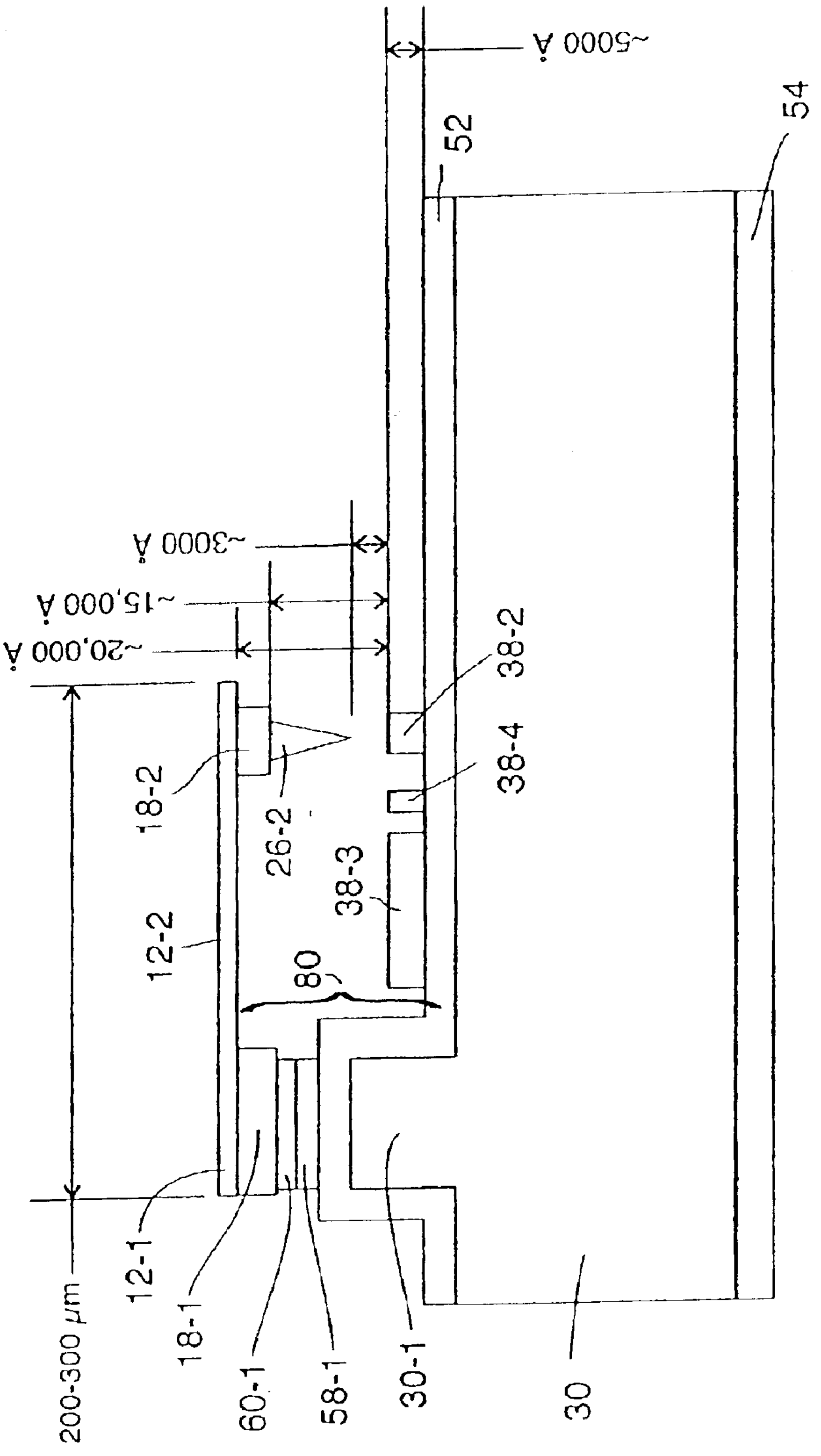

FIG. 15 is basically identical to FIG. 14, but shows the MEM sensor in somewhat more detail and the preferred dimensions of the MEM sensor are also shown on this figure.

It will be recalled that in this embodiment, a layer of Ti/Pt/Au 18 was applied forming contacts 18-1 and 18-2 which were sintered in order to form an ohmic bond with Boron-doped cantilever 12. It was noted that sintering could be avoided by providing a ribbon conductor between contacts 18-1 and 18-2. Such a modification is now described in greater detail and is depicted starting with FIGS. 16A and 16B.

According to this modification, the thin Si layer 12 formed on silicon wafer 10 may be (i) doped with Boron or (ii) may be either undoped or doped with other impurities and formed by methods other than epitaxial growth. If undoped (or doped with other impurities), then a thin etch stop layer 11 is formed between the thin Si layer 12 and the silicon wafer 10. This configuration is called Silicon On Insulator (SOI) and the techniques for making an SOI structure are well known in the art and therefor are not described here in detail. The etch stop layer 11, if used, is preferably a layer of $SiO_2$ having a thickness of about 1–2 μm and can then be made, for example, by the implantation of oxygen into the silicon wafer 10 through the exposed surface so as to form the etch stop layer 11 buried below the exposed surface of the silicon wafer 10 and thus also define, at the same time, the thin layer of silicon 12 adjacent the exposed surface. This etch stop layer 11 will be used to release the cantilevered beam from wafer 10. If layer 12 is doped with Boron, it is doped to reduce the resistivity of the epitaxial layer 12 to less than 1 Ω-cm. At that level of Boron doping the epitaxial layer 12 can resist a subsequent EDP etch used to release the cantilevered beam from wafer 10 and thus an etch stop layer is not needed.

Figure 16A:
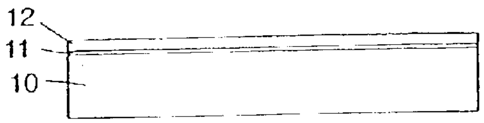
Figure 16B:
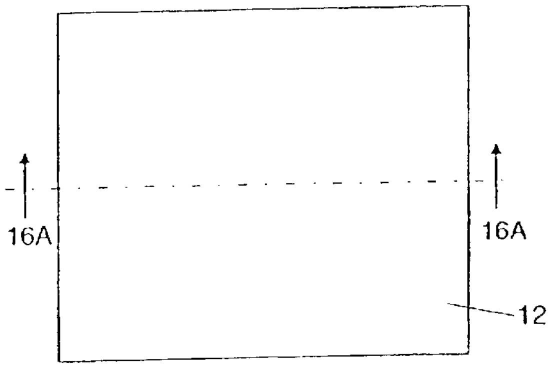

Optionally, the silicon wafer 10 with the thin doped or undoped Si layer 12 formed thereon (as shown in FIGS. 16A and 16B) may be subjected to thermal oxidation to form a relatively thin layer of $SiO_2$ on the exposed surface of layer 12. Layer 12 is preferably about 1.2 μm thick (but it can be thinner or thicker depending upon the application). The thickness of the optional $SiO_2$ layer is preferably on the order of 0.2 μm. To arrive at this point, both major surfaces may be oxidized and the oxide stripped from the bottom layer, if desired. The optional oxide layer may be used to provide an even better barrier against diffusion of Si from the beam into the Au of the tunneling tip to be formed at one end of the beam. This optional oxide layer may be used with any embodiment of the cantilevered beam, but is omitted from most of the figures for ease of illustration. It does appear, however, in FIGS. 25 and 27 and is identified there by element number 70.

Figure 17A:
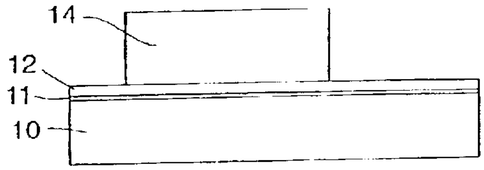
Figure 17B:
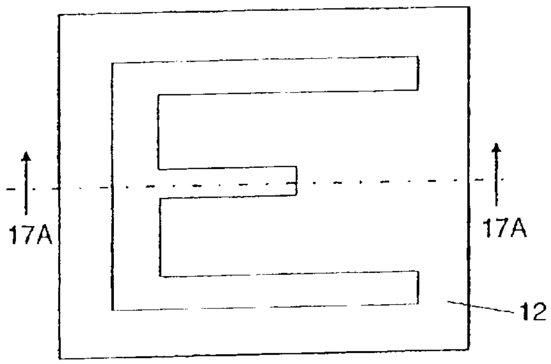
Figure 18A:
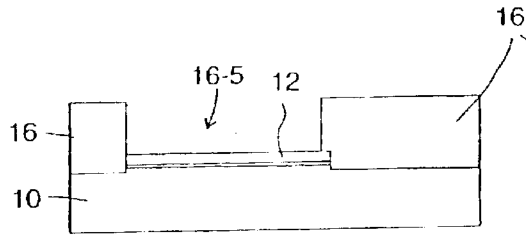
Figure 18B:
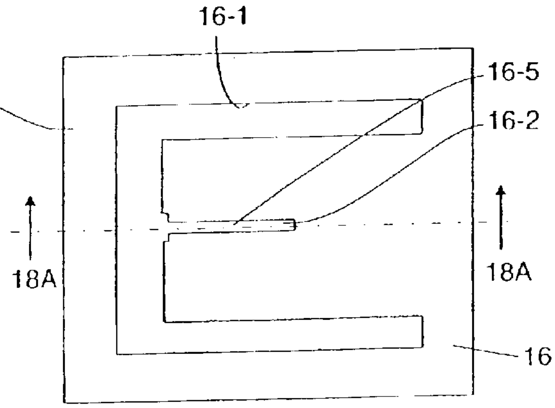

Turning now to FIGS. 17A and 17B, a layer of photoresist 14 is then applied on layer 12 (or on the optional oxide layer 70, if present) and patterned preferably to assume the same "E" letter shape as the layer photoresist 14 discussed with reference to FIGS. 2A and 2B. The structure shown in FIGS. 17A and 17B is then subjected to a plasma etch which etches through layers 11 and 12 into the silicon substrate 10 by approximately 500 Å. Then a layer of photoresist 16 is applied and patterned as shown by FIGS. 18A and 18B. The layer 16 of photoresist is patterned to assume basically the same arrangement and configuration as layer 16 discussed with respect to FIGS. 3A and 3B except that an additional opening 16-5 is included communicating between openings 61-1 and 16-2 to provide for the formation of a ribbon conductor 18-5 when a layer 18 of metals, preferably Ti/Pt/Au, is subsequently deposited on photoresist 16. After depositing the layer 18, the photoresist 16 is removed lifting off the portions of the layer 18 formed thereon, leaving portions 18-1, 18-2 and 18-5 of layer 18 on the underlying layer 12 as shown in FIGS. 19A and 19B, or on the optional oxide layer 70, if present.

Figure 19A:
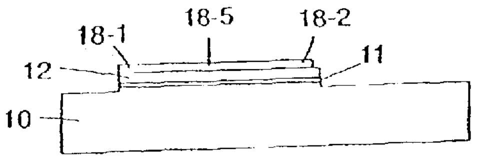
Figure 19B:
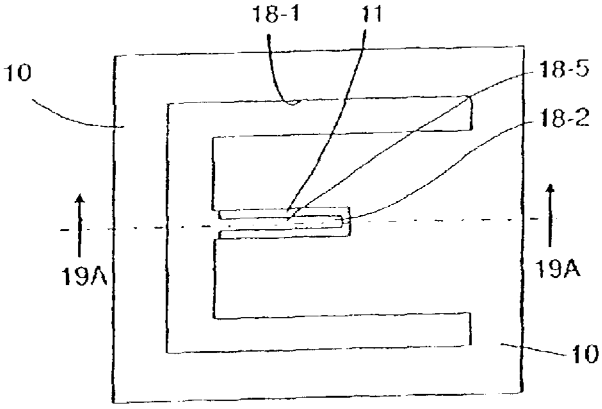
Figure 20A:
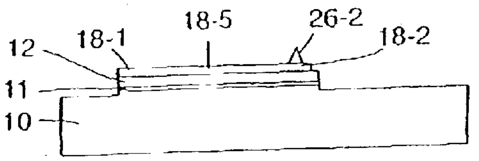
Figure 20B:
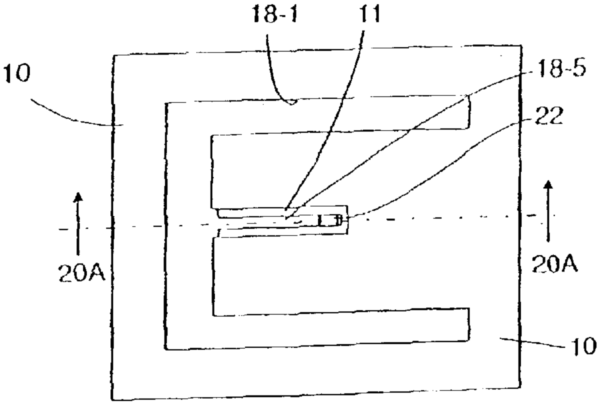
Figure 21A:
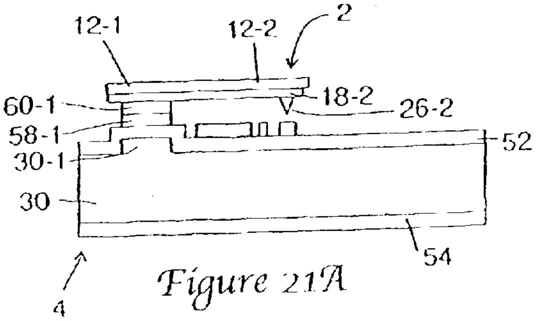
Figure 21B:
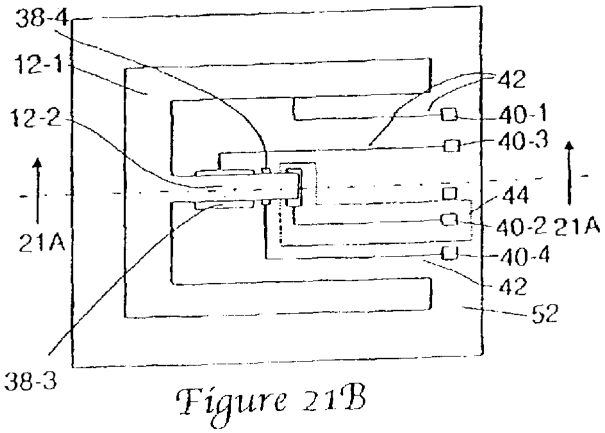

After arriving at the structure shown in FIGS. 19A and 19B, a tunneling tip 26-2 is added by appropriate masking and deposition of layer 26 (see FIG. 5A) Au or a layer of Ti/Pt/Au, for example, thereby arriving at the structure shown by FIGS. 20A and 20B. If the silicon base 30 is formed with a protrusion 30-1 (see FIG. 8A, for example), then the MEM sensor can be completed as previously described with reference to FIGS. 12 and 13. After bonding the structure depicted by FIGS. 20A and 20B to the base structure 4 of FIGS. 11A and 11B and releasing the silicon wafer 10 from the cantilevered beam, the structure shown by FIGS. 21A and 21B is arrived at. The cantilevered beam 12 is preferably released by performing two plasma etches. The first etch dissolves wafer 10 and the second etch removes the etch stop layer 11.

The protrusion 30-1 can be omitted, if desired, in which case it is then replaced by making layer 58-1 and/or layer 60-1 of a relatively thick layer of metal, such as Ti/Pt/Au, with opposing layers of Au and Au/Si eutectic applied thereon to confront each other when the two portions are brought together and eutectically bonded as previously described. However, this often requires additional masking steps since the other metal layers normally formed at the same time as layers 58-1 amd/or 60-1 should remain thin. The use a protrusion 30-1 is preferred since the resulting structure is believed to be more stable and since it simplifies the formation of the various metal layers.

Also instead of forming the protrusion from layer 30 of the base 4 portion, it could instead be formed from layer 10 of the cantilevered beam forming portion 2 or, as a further alternative, protrusions could be formed from both layers 10 and 30. Preferably, however, the protrusion 30-1 is formed from the base portion 4.

Figure 22:
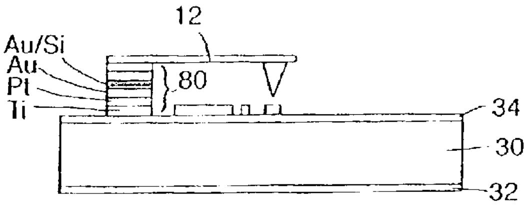
FIG. 22 depicts a side elevational section view of another embodiment of a MEM sensor, this embodiment having a preferably eutectic bond in a central region of its columnar support.

FIG. 22 shows another embodiment of a MEM sensor. In this case the MEM sensor is shown in its completed form. With the information already presented herein, those skilled in the art will not find it difficult to modify the detailed description already given to produce this embodiment and still further embodiments, all of which will now be discussed.

Figure 23:
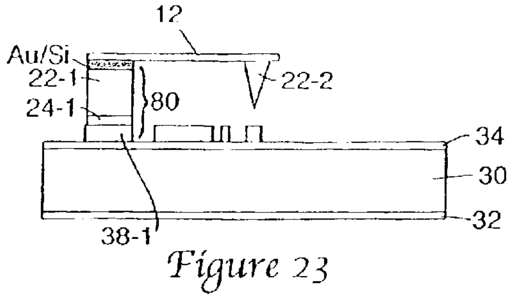
FIG. 23 depicts a side elevational section view of yet another embodiment of a MEM sensor, this embodiment having a preferably eutectic bond adjacent the cantilevered beam 12.

In the embodiment of FIG. 22, the preferable eutectic bond occurs closer to a center point in the supporting arm 80 between the Au and Au/Si layers and no protrusion is utilized in this embodiment. Otherwise this embodiment is similar to the embodiment described with reference to FIGS. 1A–15. In the embodiment of FIG. 23, the preferable eutectic bond occurs between the Au and Au/Si layers which are arranged close to the cantilevered beam 12 as opposed to close to base 4. In the case of the embodiments of FIGS. 22 and 23, the cantilevered beam 12 should have good conductivity so that it acts as a conduction path between contact 22-2 at the end of the beam 12 and contact 40-1 on the base 4. Preferably the resistivity of the boron doped silicon cantilevered beam 12 is less than 0.05 Ω-cm. Due to the low resistivity of the beam 12, EDP may be used to etch away substrate 10 (see FIGS. 10 and 11 and the related description). Preferably, however, a SOI wafer is used in the embodiments of FIGS. 22 and 23 and the $SiO_2$ layer 11 (FIGS. 16A–20B) is used as an etch stop layer to protect the beam 12 when etching away substrate 10 and therefore layer 12 need not be doped with Boron (to protect against an EDP etch) but rather doped with other impurities to achieve a lower resistance.

Comparing the embodiments of FIGS. 15, 21, 22 and 23, the embodiments of FIGS. 15 and 21 are preferred since they only need a relatively thin metal mating layer and provide a more rigid Si post or protrusion 30-1 for better stability.

Figure 24:
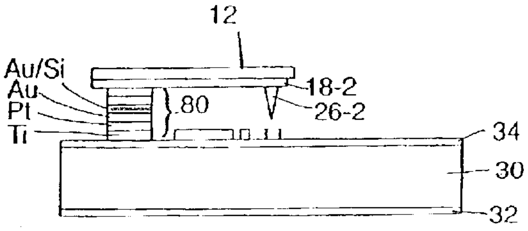
FIG. 24 depicts a side elevational section view of still another embodiment of a MEM sensor, this embodiment having a preferably eutectic bond in a central region of its columnar support as in the embodiment of FIG. 30, but also having a ribbon conductor on the cantilevered beam structure.
Figure 25:
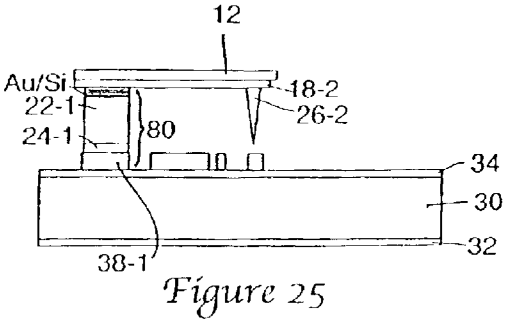
FIG. 25 depicts a side elevational section view of another embodiment of a MEM sensor, t this embodiment having a preferably eutectic bond adjacent the cantilevered beam structure as in the case of the embodiment of FIG. 31, but also having a ribbon conductor on the cantilevered beam structure.
Figure 26:
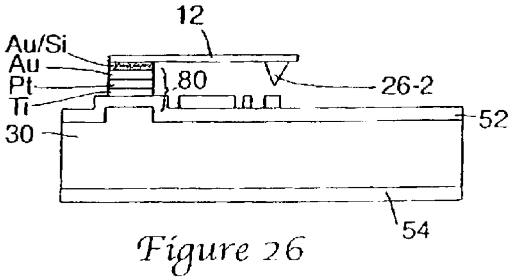
FIG. 26 depicts a side elevational section view of still another embodiment of a MEM sensor, this embodiment having a preferably eutectic bond adjacent the cantilevered beam, but also utilizing a base structure having a silicon protrusion which forms part of the columnar support structure.
Figure 27:
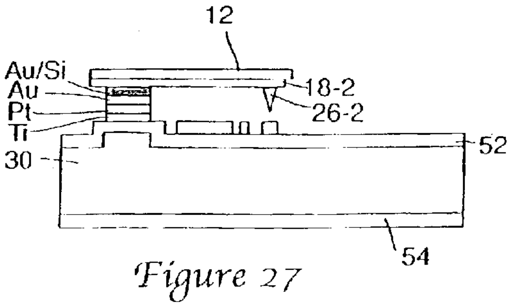
FIG. 27 depicts a side elevational section view of yet another embodiment of a MEM sensor, this embodiment having a preferably eutectic bond adjacent the cantilevered beam and utilizing a base structure having a silicon protrusion which forms part of the columnar support structure as in the case of the embodiment of FIG. 26, but also utilizing a ribbon conductor on the cantilevered beam structure.
Figure 28:
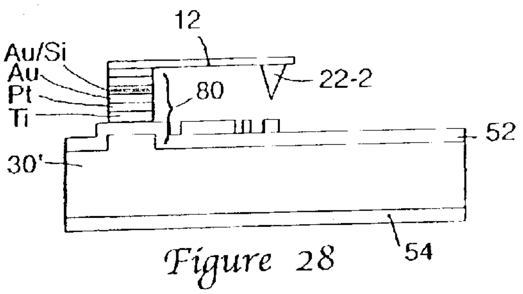
FIG. 28 depicts a side elevational section view of another embodiment of a MEM sensor, this embodiment having a preferably eutectic bond in a central region of its columnar support, but also utilizing a base structure having a silicon protrusion which forms part of the columnar support structure.
Figure 29:
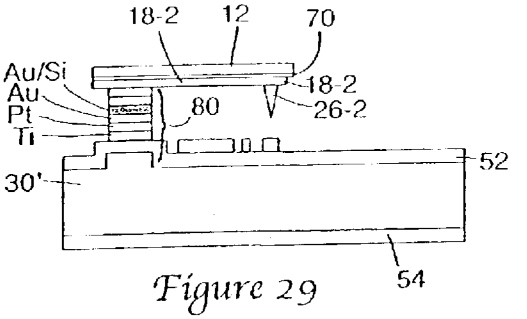
FIG. 29 depicts a side elevational section view of another embodiment of a MEM sensor, this embodiment having a preferably eutectic bond in a central region of its columnar support and a base structure having a silicon protrusion which forms part of the columnar support structure as in the embodiment of FIG. 28, but also utilizing a ribbon conductor on the cantilevered beam structure.
Figure 30:
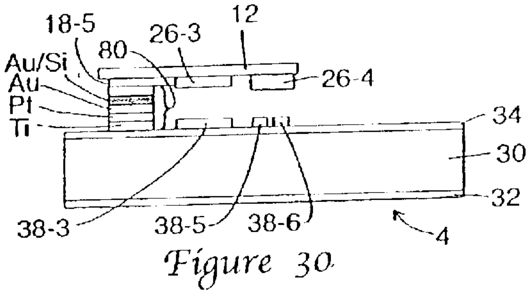
FIG. 30 depicts a side, elevational section view of an embodiment of a MEM switch, this embodiment being similar to the sensor embodiment of FIG. 32, but being equipped with an additional pad which is used to apply electrostatic forces to the beam to close the switch.
Figure 31:
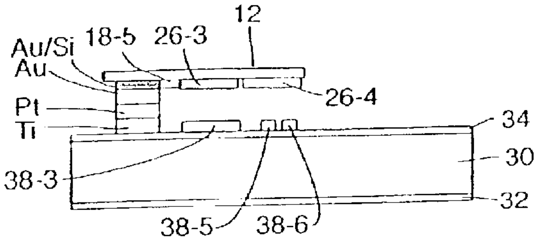
FIG. 31 depicts a side elevational section view of another embodiment of a MEM switch, this embodiment being similar to the switch embodiment of FIG. 38, but the preferably eutectic bond occurs adjacent the cantilevered beam as opposed in a central region of the columnar support.

The embodiments of FIGS. 24 and 25 are similar to the embodiments of FIGS. 22 and 23, but these two embodiments make use of the ribbon conductor 18-5 described with reference to FIGS. 16A through 21B. For these embodiments, if layer 12 is doped with Boron, the resistivity of the cantilevered beam 12 is preferably less than 1 Ω-cm. The ribbon conductor allows the use of higher resistivity silicon for the cantilevered beam 12. If layer 12 is doped with Boron, then the cantilevered beam can be released from wafer 10 using EDP as the echtant. Preferably, an SIO construction is utilized with a SiO2 stop layer 11 (See FIGS. 16A–21B) utilized to protect the beam 12 while the substrate 10 is etched away.

The embodiments of FIGS. 26–29 are similar to the embodiments of Figures, respectively, but a substrate with a silicon protrusion 30-1 is utilized, as described with reference to the embodiments of FIGS. 1A–21.

Generally speaking, embodiments which utilize the a base substrate 30 with a silicon post or protrusion 30-1, are believed to give the resulting sensors and switches better mechanical stability.

The structure which has been described so far has been set up as a sensor. Those skilled in the art know not only how to utilize these structures as a sensor but also know how to modify these structures, when needed, to make them function as a switch. The sensor devices shown in the preceding figures are preferably used as accelerometers, although they can be used for other types of sensors (such as gyroscopes, magnetometers, etc.) or as switches, as a matter of design choice, and with appropriate modification when needed or desired.

Four embodiments of a switch version of a MEM device in accordance with the present invention will now be described with reference to FIGS. 30–33. In order to function as a switch, two metal pads 26-3 and 26-4 are deposited on the cantilevered beam structure 12 instead of a pointed contact 26-2. In these embodiments the cantilevered beam 14 is preferably formed of undoped silicon. When the switch closes, the metal pad 26-4 bridges two contacts 38-5 and 38-6, which are deposited at the same time that layer 38 is deposited on the base structure 4. The ribbon conductor 18-5 described with reference to FIGS. 16A through 21B is utilized, due to the relatively high resistivity of undoped Si, to bring an electrical connection with metal pad 26-3 down to the base substrate 4. The switch is closed by imparting an electrostatic force on the cantilevered beam 12 by applying a voltage between metal pads 38-3 and 26-3. That voltage causes the metal pad 26-4 to make a circuit connecting contacts 38-5 and 38-6 when the metal pad 26-4 makes physical contact with those two contacts when the switch closes. Otherwise these embodiments are similar to the previously discussed embodiments. It should be noted, however, that since the cantilevered beam 12 is preferably formed of undoped silicon, the EDP etchant will not prove satisfactory. Instead the $SiO_2$ etch stop layer 11 described with reference to FIGS. 16A–21B is preferably used to protect the beam 12 when etching away substrate 10.

Figure 32:
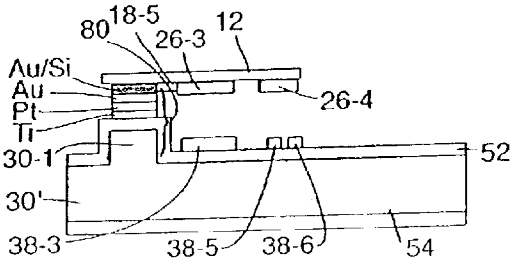
FIG. 32 depicts a side elevational section view of yet another embodiment of a MEM switch, this embodiment utilizing a base structure having a silicon protrusion which forms part of the columnar support structure for the cantilevered beam.
Figure 33:
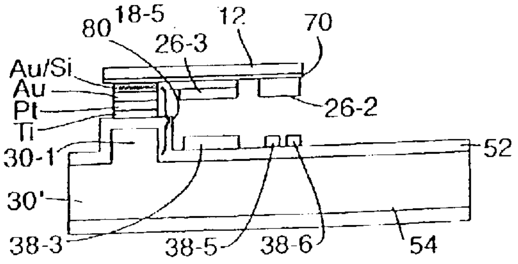
FIG. 33 depicts a side elevational section view of yet another embodiment of a MEM switch, this embodiment being similar to the switch embodiment of FIG. 32, but including an $SiO_2$ layer between the ribbon conductor and the Si of the cantilevered beam.

In the embodiment of FIG. 32 the Au/Si eutectic layer is disposed next to the beam and in this embodiment the base structure 4 has a protrusion 30-1 which acts as a portion of the column 80 which supports the beam 12. Of the switch embodiments, the embodiment of FIG. 32 is preferred for the same reason that sensors with a protrusion 30-1 in their base structures 4 are also preferred, namely, it is believed to give the resulting sensors and switches better mechanical stability.

In FIG. 32 an $SiO_2$ layer 70 is shown disposed between beam 12 and layer 18. Layer 18 preferably is formed of layers of Ti, Pt and Au. The Pt acts as a diffusion barrier to the Si to keep it from migrating into the Au contacts. If layer 18 does not provide adequate protection for whatever metal is used in making contacts, then the use of a diffusion barrier such a $SiO_2$ layer 70 would be appropriate.

The structures shown in the drawings has been described in many instances with reference to a capital letter 'E'. However, this shape is not particularly critical, but it is preferred since it provides good mechanical support for the cantilevered structure formed primarily by beam portion of layer 12. Of course, the shape of the supporting structure or mating structure around cantilever beam 12 can be changed as a matter of design choice and it need not form the perimeter of the capital letter 'E', but can form any convenient shape, including circular, triangular or other shapes as desired.

In the embodiment utilizing a ribbon conductor on the cantilevered beam 12, the pads and contacts (e.g. 26-2 and 26-3) formed on the beam 12 are generally shown as being formed over the ribbon conductor 18-1, 18-2, 18-5. The ribbon conductor on the beam can be routed in any convenient fashion and could butt against or otherwise make contact with the other metal elements formed on the cantilevered beam 12 in which case elements such as 26-2 and 26-3 could be formed directly on the beam 12 itself.

The contacts at the distal ends of the cantilevered beams are depicted and described as being conical or triangular. Those skilled in the art will appreciate that those contacts may have other configurations and may be flat in some embodiments.

Throughout this description are references to Ti/Pt/Au layers. Those skilled in the art will appreciate that this nomenclature refers to a situation where the Ti/Pt/Au layer comprises individual layers of Ti, Pt and Au. The Ti layer promotes adhesion, while the Pt layer acts as a barrier to the diffusion of Si from adjacent layers into the Au. Other adhesion layers such as Cr and/or other diffusion barrier layers such as a Pd could also be used or could alternatively be used. It is desirable to keep Si from migrating into the Au, if the Au forms a contact, since if Si diffuses into an Au contact it will tend to form $SiO_2$ on the exposed surface and, since $SiO_2$ is a dielectric, it has deleterious effects on the ability of the Au contact to perform its intended function. As such, a diffusion barrier layer such as Pt and/or Pd is preferably employed between an Au contact and adjacent Si material. However, an embodiment is discussed wherein the diffusion barrier purposefully omitted to form an Au/Si eutectic.

The nomenclature Au/Si or Au—Si refers a mixture of Au and Si. The Au and Si can be deposited as separate layers with the understanding that the Si will tend to migrate at elevated temperature into the Au to form an eutectic. However, for ease of manufacturing, the Au/Si eutectic is preferably deposited as a mixture except in those embodiments where the migration of Si into Au is specifically relied upon to form Au/Si.

Many different embodiments of a MEM device have been described. Most are sensors and some are switches. Many more embodiments can certainly be envisioned by those skilled in the art based the technology disclosed herein. But in all cases the base structure 4 is united with the cantilevered beam forming structure 2 by applying pressure and preferably also heat, preferably to cause an eutectic bond to occur between the then exposed layers of the two structures 2 and 4. The bonding may instead be done non-eutectically, but then higher temperatures must be used. Since it is usually desirable to reduce and/or eliminate high temperature fabrication processes, the bonding between the two structures 2 and 4 is preferably done eutectically and the eutectic bond preferably occurs between confronting layers of Si and Au/Si.

Having described the invention with respect to certain preferred embodiments thereof, modification will now suggest itself to those skilled in the art. The invention is not to be limited to the foregoing description, except as required by the appended claims.

What is claimed is:

1. A method of making a MEM switch or tunneling sensor comprising the steps of:

(a) defining a cantilevered beam structure and a mating structure on a first substrate or wafer;

(b) forming at least one contact structure and a mating structure on a second substrate or wafer, the mating structure on the second substrate or wafer being of a complementary shape to the mating structure on the first substrate or wafer, at least one of the two mating structures including a protrusion extending from the substrate or wafer from which the at least one protrusion is defined;

(c) positioning the mating structure of the first substrate or wafer into a confronting relationship with the mating structure of the second substrate or wafer;

(d) bonding a layer associated with said mating structure on the first substrate or wafer with a layer associated with the mating structure on the second substrate or wafer;

(e) removing at least a portion of the first substrate or wafer to release the cantilevered beam structure.

2. A method of making a MEM switch or tunneling sensor as claimed in claim 1 wherein the second substrate or wafer is formed of silicon.

3. A method of making a MEM switch or tunneling sensor as claimed in claim 2 wherein the silicon forming the second substrate or wafer is of a single crystalline structure.

4. A method of making a MEM switch or tunneling sensor as claimed in claim 3 wherein the crystalline structure of the silicon is <100>.

5. A method of making a MEM switch or tunneling sensor as claimed in claim 4 wherein the silicon is n-type.

6. A method of making a MEM switch or tunneling sensor as claimed in claim 1 wherein the first substrate or wafer is formed of silicon.

7. A method of making a MEM switch or tunneling sensor as claimed in claim 6 wherein the silicon forming the first substrate or wafer is of a single crystalline structure.

8. A method of making a MEM switch or tunneling sensor as claimed in claim 7 wherein the crystalline structure of the silicon in the first substrate or wafer is <100>.

9. A method of making a MEM switch or tunneling sensor as claimed in claim 8 wherein the silicon of the first substrate or wafer is n-type.

10. A method of making a MEM switch or tunneling sensor as claimed in claim 1 wherein heat is applied together with pressure between the two substrates so as to cause an eutectic bond to occur between the two mating structures.

11. A method of making a MEM switch or tunneling sensor as claimed in claim 1 wherein the cantilevered beam structure is formed by:

(a) forming an epitaxial layer of silicon on said first substrate or wafer, said epitaxial layer being doped;

(b) masking and etching the epitaxial layer of silicon to define a beam structure disposed on said first substrate or wafer; and (c) wherein the cantilevered beam structure is released by removing the first substrate or wafer by etching.

12. A method of making a MEM switch or tunneling sensor as claimed in claim 11 wherein a contact is formed on an end of said beam structure by depositing a metal through a small opening in a temporary mask layer, the small opening being sufficiently small that the metal being deposited tends to overhang the small opening increasingly as the deposition of the metal proceeds whereby the contact being deposited through the small opening assumes an elongate shape of decreasing cross section as the deposition proceeds.

13. A method of making a MEM switch or tunneling sensor as claimed in claim 11 wherein a contact is formed on an end of said beam structure by depositing a metal through an opening in a temporary mask layer, the metal deposited through the opening forming a planar contact at the end of said beam structure.

14. A method of making a MEM switch or tunneling sensor as claimed in claim 11 wherein etching accomplished by ethylenediamine pyrocatechol as an etchant.

15. A method of making a MEM switch or tunneling sensor as claimed in claim 14 wherein the epitaxial layer is doped with boron at a sufficient concentration to reduce the resistivity of the epitaxial layer to less than 0.05 Ω-cm.

16. A method of making a MEM switch or tunneling sensor as claimed in claim 15 wherein a layer of metal, is selectively deposited on said epitaxial layer and sintered at an elevated temperature to form first and second ohmic contacts on said epitaxial layer, said second ohmic contact being disposed near a distal end of the beam structure and the first ohmic contact forming the mating structure on the first substrate or wafer.

17. A method of making a MEM switch or tunneling sensor as claimed in claim 16 wherein the layer of metal is formed of individual layers of Ti, Pt and Au.

18. A method of making a MEM switch or tunneling sensor as claimed in claim 1 wherein the cantilevered beam structure is formed by:

(a) forming an etch stop layer on said first substrate or wafer (b) providing a thin layer of silicon on said etch stop layer;

(c) masking and etching the thin layer of silicon to define a beam structure disposed on said first substrate or wafer; and (d) wherein the cantilevered beam structure is released by (i) removing the first substrate or wafer by a first etch, the etch stop layer being resistant to said first etch, and (ii) removing the etch stop layer by a second etch.

19. A method of making a MEM switch or tunneling sensor as claimed in claim 18 wherein the layer of silicon is undoped and wherein (i) a contact is formed on said beam structure spaced from the mating structure and (ii) conductive material is formed on said beam structure between said contact and said mating structure.

20. A method of making a MEM switch or tunneling sensor as claimed in claim 18 wherein the layer of silicon is doped in order to render it conductive.

21. A method of making a MEM switch or tunneling sensor as claimed in claim 1 further including forming contacts, preferably of Ti/Pt/Au, on said second substrate or wafer, at least one of said contacts on the second substrate or wafer defining, in combination with the protrusion, the mating structure on the second substrate or wafer.

22. A method of making a MEM switch or tunneling sensor as claimed in claim 21 wherein an eutectic layer is provided by a layer of Au—Si eutectic formed on the Ti/Pt/Au contact on said second substrate or wafer and/or by a layer of Au—Si eutectic formed on an ohmic contact on the first substrate or wafer.

23. A method of making a MEM switch or tunneling sensor as claimed in claim 1 wherein the bonding occurs eutectically and wherein silicon for the eutectic bond is provided by the silicon substrate of the second substrate or wafer at the mating structure.

24. A method of making a MEM switch or tunneling sensor as claimed in claim 1 wherein a layer of metal, preferably formed of individual layers of Ti, Pt and Au, is selectively deposited on said cantilevered beam structure to form a first ohmic contact and a second layer of metal without a diffusion barrier, preferably Ti/Au, is selectively deposited on said cantilevered beam structure to form a second ohmic contact, both metal layers being sintered at an elevated temperature, said first ohmic contact being disposed near a distal end of the beam structure and the second ohmic contact forming the mating structure on the first substrate or wafer.

25. A method of making a MEM switch or tunneling sensor as claimed in claim 1 wherein a layer of metal, preferably formed of individual layers of Ti, Pt and Au, is selectively deposited on said cantilevered beam structure and is sintered at an elevated temperature to define a first ohmic contact, said first ohmic contact being disposed near a distal end of the beam structure and wherein mating of the first and second substrates or wafers occurs between a metal layer, preferably Au, deposited on the second substrate or wafer and the cantilevered beam structure defined on the first substrate or wafer.

26. A method of making a MEM switch or tunneling sensor as claimed in claim 1 wherein a patterned metal layer, preferably formed of Ti/Pt/Au, is selectively deposited on said cantilevered beam structure to form first and second interconnected contacts on said cantilevered beam structure, the contacts being interconnected by an elongate conductive ribbon layer, preferably of Ti/Pt/Au, said second interconnected contact being disposed near a distal end of the beam structure, the elongate layer being disposed longitudinally on the beam structure and preferably substantially narrower than the cantilevered beam structure, said first interconnected contact forming the mating structure on the first substrate or wafer.

27. A method of making a MEM switch or tunneling sensor as claimed in claim 26 further including forming a patterned metal layer, preferably formed of Ti/Pt/Au, supported by said protrusion which protrudes from a major surface of said second substrate or wafer, said patterned metal layer on the second substrate or wafer defining, in combination with the protruding portion, the mating structure on the second substrate or wafer.

28. A method of making a MEM switch or tunneling sensor as claimed in claim 27 further including forming an Au/Si eutectic layer of at least one of said metal layers.

29. A method of making a MEM switch or tunneling sensor as claimed in claim 28 wherein the bonding occurs eutectically between the eutectic layer and an adjacent a layer of Au.

30. A method of making a MEM switch or tunneling sensor as claimed in claim 27 wherein the bonding occurs eutectically and wherein silicon for the eutectic bond is provided by the silicon substrate of the second substrate or wafer at the mating structure.

31. A method of making a MEM switch or tunneling sensor as claimed in claim 1 wherein the cantilevered beam structure is formed by:

(a) forming a etch stop layer on said first substrate or wafer, (b) forming an thin layer of silicon on said etch stop layer;

(c) masking and etching the thin layer of silicon to define a beam structure disposed adjacent said first substrate or wafer;

(d) removing the first substrate or wafer by use of an etchant to which said etch stop layer is resistant; and (e) removing said etch stop layer using an etchant to which said cantilevered beam structure is resistant.

32. A method of making a MEM switch or tunneling sensor as claimed in claim 31 wherein a layer of Ti/Pt/Au is selectively deposited on said thin layer to form first and second metal contacts on said thin layer, said second contact being disposed near a distal end of said beam structure and said first contact forming the mating structure on the first substrate or wafer.

* * * * *